(12) United States Patent
Choi

(10) Patent No.: US 6,784,034 B1
(45) Date of Patent: Aug. 31, 2004

(54) METHOD FOR FABRICATING A THIN FILM TRANSISTOR

(75) Inventor: Duck-Kyun Choi, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/170,625

(22) Filed: Oct. 13, 1998

(51) Int. Cl.[7] ............................................. H01L 21/336
(52) U.S. Cl. ........................ 438/164; 438/166; 438/308
(58) Field of Search ......... 257/E21.133; 438/FOR 184, 438/308, 166, 149, 164, 795

(56) References Cited

U.S. PATENT DOCUMENTS

| 4,309,225 A | 1/1982 | Fan et al. ..................... 148/1.5 |
| 4,626,448 A | 12/1986 | Hays ........................... 427/39 |
| 5,147,826 A | 9/1992 | Liu et al. |
| 5,275,851 A | 1/1994 | Fonash et al. |
| 5,364,664 A | 11/1994 | Tsubouchi et al. .......... 427/535 |
| 5,403,763 A | 4/1995 | Yamazaki |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. ................ 437/21 |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,569,610 A | 10/1996 | Zhang et al. |
| 5,576,222 A | * 11/1996 | Arai et al. |
| 5,619,044 A | 4/1997 | Makita et al. ................ 257/64 |
| 5,639,698 A | 6/1997 | Yamazaki et al. .......... 437/228 |
| 5,663,077 A | 9/1997 | Adachi et al. .............. 438/151 |
| 5,677,240 A | 10/1997 | Murikami et al. .......... 437/195 |
| 5,985,741 A | 11/1999 | Yamazaki et al. .......... 438/486 |
| 6,066,547 A | * 5/2000 | Maekawa |
| 2001/0018240 A1 | * 8/2001 | Joo et al. ..................... 438/166 |
| 2002/0034842 A1 | * 3/2002 | Joo et al. ..................... 438/149 |
| 2002/0047118 A1 | * 4/2002 | Zhang et al. ................. 257/57 |

FOREIGN PATENT DOCUMENTS

| JP | 21-40915 | 5/1990 |
| JP | 80-06053 | 1/1996 |

OTHER PUBLICATIONS

Y. Kawazu, et al., "Low Temperature Crystallization of Hydrogenated Amorphous Silicon Induced by Nickel Silicide Formation", Japanese Journal of Applied Phys., vol. 29, No. 12, Dec. 1990, pp. 2698–2704.

(List continued on next page.)

Primary Examiner—George Fourson
(74) Attorney, Agent, or Firm—McKenna Long & Aldridge LLP

(57) ABSTRACT

A method of fabricating a thin film transistor includes forming an amorphous silicon layer as an active layer on a substrate, forming a gate insulating layer and a gate electrode on the amorphous silicon layer, doping impurities of a first conductive type in the amorphous silicon layer, forming a metal layer on the exposed portions of the amorphous silicon layer, and crystallizing the amorphous silicon layer by applying thermal treatment and electric field to the resultant substrate.

37 Claims, 12 Drawing Sheets

OTHER PUBLICATIONS

K.S. Song, S.H. Park, S.I. Jun and D.K. Choi, "A Crystallization of the Amorphous Silicon Using Using Field Aided Lateral S, H Crystallization" Department of Inorganic Materials Engineering, Hanyang University, 1997, pp. 144–150. (Abstract only).

Kyung–Sub Song and Duck–Kyun Choi, "Electric Field Effect on the Metal Induced Crystallization of Amorphous Silicon," Proceedings of the Eighth International Symposium on Silicon–on Insulator Technology and Devices, vol. 97–23, pp. 75–80, Aug. 31, 1997.

Seung–Ik Jun, Kyung–Sub Song, Sang–Hyun Park and Duck–Kyun Choi, "Fabrication of Low Temperature Poly–Silicon Thin Film Transistor Using Field Aided Lateral Crystallization (FALC)," The First Asian–European International Conference on Plasma Surface Engineering, Oct. 5–9, 1997.

Kyung–Sub Song, Seung–Ik Jun, Sang–Hyun Park and Duck–Kyun Choi, "Enhanced Crystallization of Amorphous Silicon Using Electric Field," Proc. the 12th KACG Tech. Meeting and the 4th Korea–Japan EMGS, Jun. 12, 1997. (pp. 243 only).

Y. Masaki, P. G. LeComber, and A. G. Fitzgerald, "Solid Phase Crystallization of Thin Films of Si Prepared by Plasma–Enhanced Chemical Vapor Deposition," *J. Appl. Phys.* 74 (1), Jul. 1, 1993, pp. 129–134.

Dong Kyun Sohn, Jeong No Lee, Sang Won Kang and Byung Tae Ahn, "Low–Temperature Crystallization of Amorphous Si Films By Metal Adsorption and Diffusion," *Jpn. J. Appl. Phys.*, vol. 35 (1996) Pt. 1, No. 2B, pp. 1005–1009.

Song, Kyung–Sub, Seung–Ik Jun, Sang–Hyun Park and Duck–Kyun Choi, "I–V Characteristics of Poly–Silicon Thin Film Transistors by Field Aided Lateral Crystallization (FALC)," 5th International Conference on VLSI and CAD Oct. 13–15, 1997, Seoul, Korea. pp. 187–189.

Ryu, Jai II, Hyun Churl Kim, Sung Ki Kim and Jin Jang, "A Novel Self–Aligned Polycrystalline Silicon Thin–Film Transistor Using Silicide Layers," IEEE Electron Device Letters. vol. 11, No. 6, Jun. 1997. pp. 123–125.

* cited by examiner

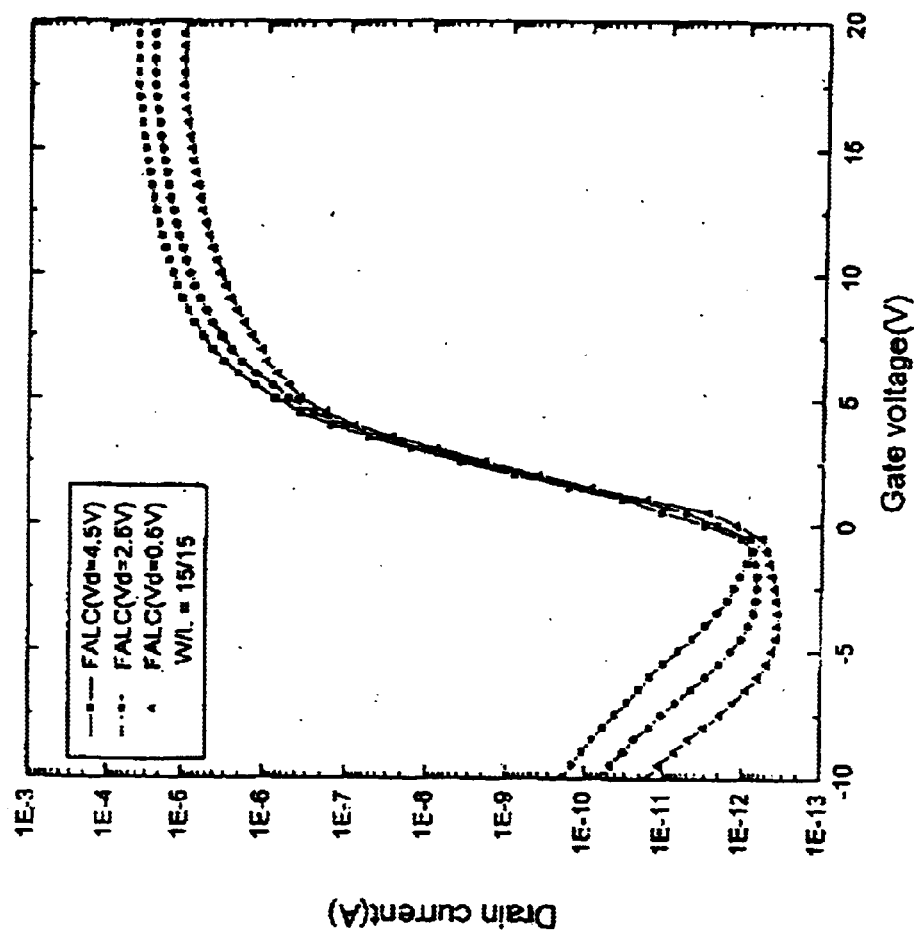

METHOD FOR FABRICATING A THIN FILM TRANSISTOR

BACKGROUND OF THE INVENTION

1. Field of the Invention

The present invention relates to a method of fabricating a thin film transistor, and more particularly, to a method of fabricating a thin film transistor by crystallizing an amorphous silicon layer into a polysilicon layer, thereby providing a polysilicon thin film transistor.

2. Discussion of the Related Art

Recently, polysilicon (poly-Si) TFTs(Thin Film Transistors) have been actively investigated due to their potential in high mobility and current driving ability. They are usually applied to three-dimensional integrated circuits and active matrix liquid crystal displays (AMLCD). A low temperature process and short process times are essential for reducing the manufacturing cost. The use of relatively inexpensive glass substrates further reduces cost. However, most of the technologies adopt high temperature process for the crystallization of amorphous silicon. In poly-Si TFTs, the crystalline quality of silicon is of great importance since the integrated circuits are built with silicon film.

The effect of a small presence of metal impurities on the crystallization of amorphous silicon film was researched by Mayer et al. Recently, one report has claimed that Ni can substantially decrease the crystallization temperature to as low as 480° C. It is proven that the nucleation and growth of crystalline silicon are mediated by the formation of nickel silicide ($NiSi_2$) and the crystallization velocity is limited by the diffusion of $NiSi_2$ in MIC(MIC: Metal Induced Crystallization) method. MIC was further improved to MILC (Metal Induced Lateral Crystallization) where the crystalline seed ($NiSi_2$) propagates into the metal-free area by thermal diffusion, thus obtaining large-grained poly-Si films with a small metal contamination.

FIG. 1A to FIG. 1B show a first example of fabricating a thin film transistor according to the related art. The following first example of the related art is from U.S. patent application Ser. No. 08/833,131, which is owned by the same assignee as the present application and is hereby incorporated by reference, and "A Novel Self-Aligned Polycrystaline Silicon Thin-Film Transistor Using Silicide Layers" by Jai Il Ryu et. al., IEEE Electron Device Letters, Vol. 18, No. 6, June 1997.

Referring to FIG. 1A, a semiconductor layer 11 and a gate insulating film 13 are formed on an insulating substrate 10 in succession. Another semiconductor layer is formed on the gate insulating film 13. The semiconductor layer on the gate insulating film 13 and the gate insulating film 13 are patterned together. Then, ion showering is performed to form heavily doped semiconductor layers 16 in the semiconductor layer on the gate insulating film 13 and the exposed semiconductor layer 11 on both sides of the gate insulating film 13.

Referring to FIG. 1B, nickel having a thickness of 30 Å is RF-sputtered on the heavily doped semiconductor layer 16 to form a nickel silicide layer 12 over the gate insulating film 13 and both sides of the gate insulating film 13. In the sputtering method, a nickel target of 6N purity is preheated for 20 minutes at a temperature of 200° C. under an initial vacuum of $3 \times 10^{-6}$ Torr. The sputtering method is performed at 75 W RF power for 5 seconds. Then, the substance is annealed in an argon ambient for one hour at a substrate temperature of 260° C. to form nickel silicide layers 12. Residual nickel that did not react with silicon is removed by a mixture of $HNO_3$ and HCl with a ratio of 1:5.

In the first example of the related art, as shown in FIG. 2, the semiconductor layer 11 is used as an active layer of the thin film transistor, and the semiconductor layer 11 is formed by crystallizing amorphous silicon layer 11L into a polysilicon layer through laser annealing. Generally, laser crystallization is performed by carrying out laser scanning on the amorphous silicon layer 11L on the substrate 10 for a long time, thereby crystallizing amorphous silicon layer into the polysilicon layer. As a result, the first example of the related art has the disadvantage of requiring a long process time. In addition, since this method gives a non-uniform crystallization, it is unsuitable for fabricating a plurality of transistors having uniform characteristics on the substrate.

FIG. 3A to FIG. 3D show a second example of fabricating a thin film transistor according to the related art. The following second example of the related art shows a method of fabricating a thin film transistor using the MILC technique.

Referring to FIG. 3A, an amorphous silicon layer is deposited on a substrate 30, and then the amorphous silicon layer is etched to form an active layer 31.

Referring to FIG. 3B, an oxide layer and an Mo layer are deposited on the active layer 31 and the substrate 30 in succession, and then, the Mo layer and the oxide layer are etched to form gate electrode 33 and gate insulating layer 32 on the active layer 31.

Referring to FIG. 3C, impurities having a first conductivity type are doped in the active layer formed by the amorphous silicon layer to form a source region 31S and a drain region 31D in the active layer 31. Then, a nickel thin film 37 is deposited on the exposed and doped active layer.

Referring to FIG. 3D, a thermal treatment is performed on the resultant substrate comprising nickel thin film 37 at a temperature of about 500° C., to crystallize the amorphous silicon layer used as the active layer 31 into a polysilicon layer 31', thereby providing a polysilicon thin film transistor.

When performing the thermal treatment, a portion of the amorphous silicon layer that contacts the nickel thin film becomes nickel silicide 37'. The nickel silicide is used as a nucleus for crystallizing amorphous silicon into polysilicon. Silicon portions contacting nickel thin film 31, for example, the source region 31S and the drain region 31D, are crystallized by MIC, and a nickel-free region, for example, a channel region 31C, is crystallized by MILC. Here, a small amount of the nickel or nickel silicide contaminates the center of the channel region.

Therefore, the second example of the related art has the disadvantages of requiring long crystallization time and decreasing the characteristics of the thin film transistor due to contamination of the crystallized silicon layer by metal impurities, such as, nickel silicide.

SUMMARY OF THE INVENTION

Accordingly, the present invention is directed to a method for fabricating a thin film transistor that substantially obviates one or more of the problem due to limitations and disadvantages of the related art.

An object of the present invention is to provide a thin film transistor with high electric field mobility.

Another object of the present invention is to provide a thin film transistor with high on/off ratio with low leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method for fabricating a thin film transistor comprises the steps of forming an amorphous silicon layer as an active layer on a substrate; forming a gate insulating layer and a gate electrode on the amorphous silicon layer; doping impurities of first conductive type in exposed portions of the amorphous silicon layer; forming metal layers on the doped portions of the amorphous silicon layer; crystallizing the amorphous silicon layer by performing heat treatment and applying electric field in the resultant substrate.

In another aspect of the present invention, a method for fabricating thin film transistor comprises the steps of forming a first amorphous silicon layer as an active layer on a substrate; forming a gate insulating layer and a second amorphous silicon layer as a gate electrode on the first amorphous silicon layer; doping impurities of first conductive type at exposed portions of the first and second amorphous silicon layers; forming metal layers on the doped portions of the first and second amorphous silicon layers; crystallizing the first and second amorphous silicon layers by performing heat treatment and applying electric field in the resultant substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrates embodiments of the invention and together with description serve to explain the principles of the invention.

In the drawings:

FIG. 7 shows transfer characteristics of the thin film transistor according to the first embodiment ot the present invention;

DETAILED DESCRIPTION OF THE PREFERRED EMBODIMENTS

Reference will now be made in detail to the preferred embodiments of the present invention, examples of which are illustrated in the accompanying drawings.

FIG. 4A to FIG. 4E show a process of fabricating a thin film transistor according to a first embodiment of the present invention.

Figure 1A:
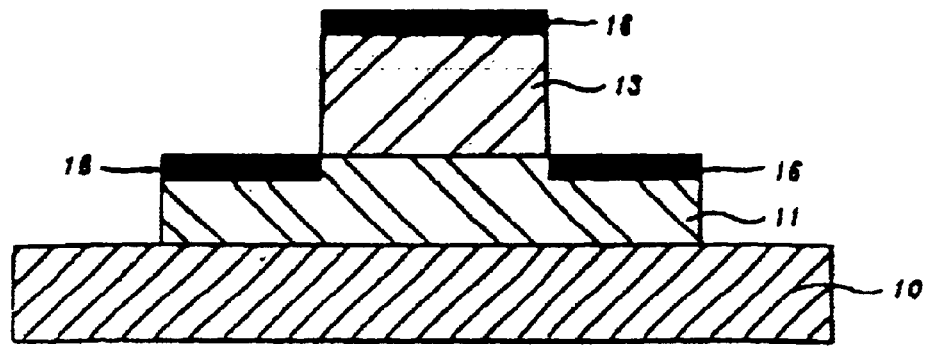
FIG. 1A to FIG. 1B show a process of fabricating a thin film transistor according to a first example of the related art.
Figure 1B:
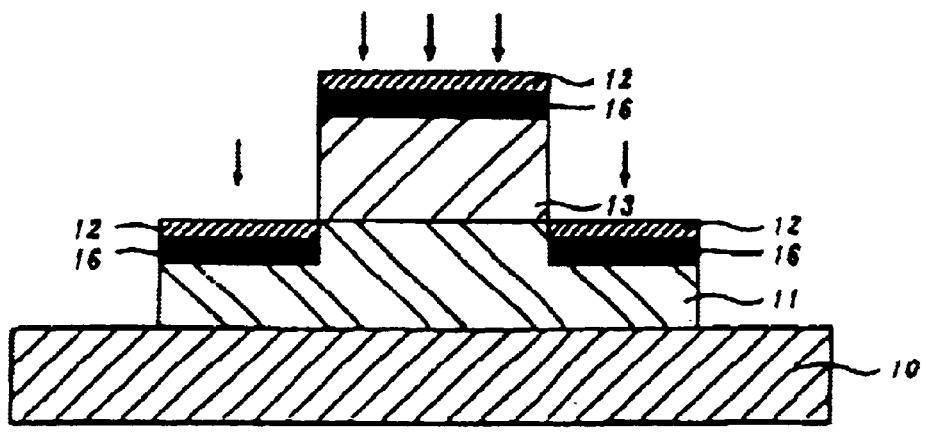
Figure 2:
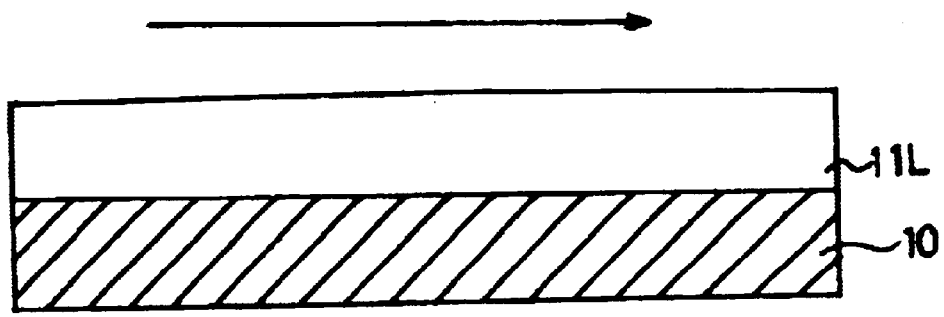
FIG. 2 shows a laser annealing technique for crystallizing an amorphous silicon layer according to the first example of the related art.
Figure 3A:
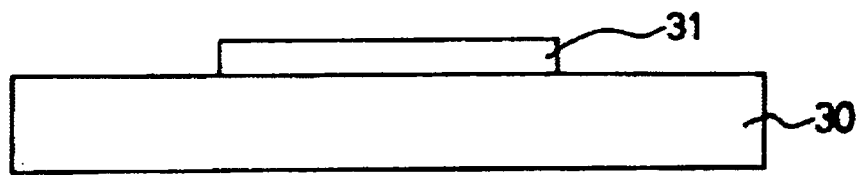
FIG. 3A to FIG. 3D show a process of fabricating a thin film transistor according to a second example of the related art.
Figure 3B:
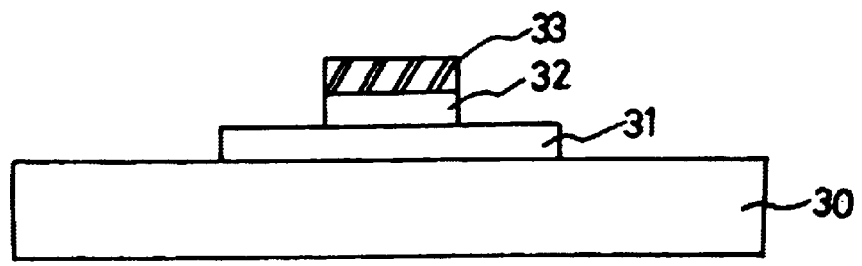
Figure 3C:
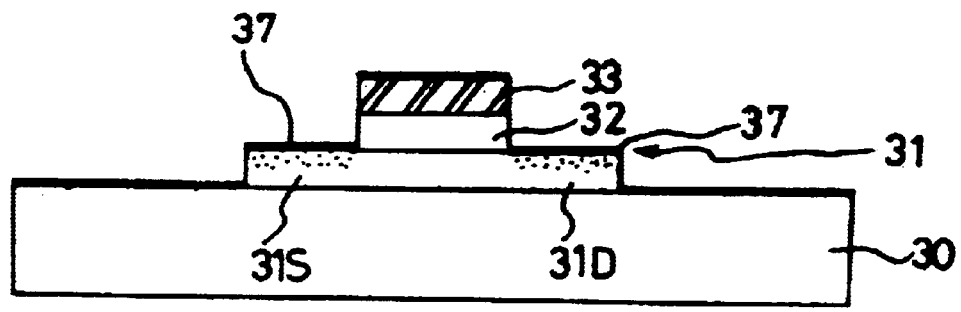
Figure 3D:
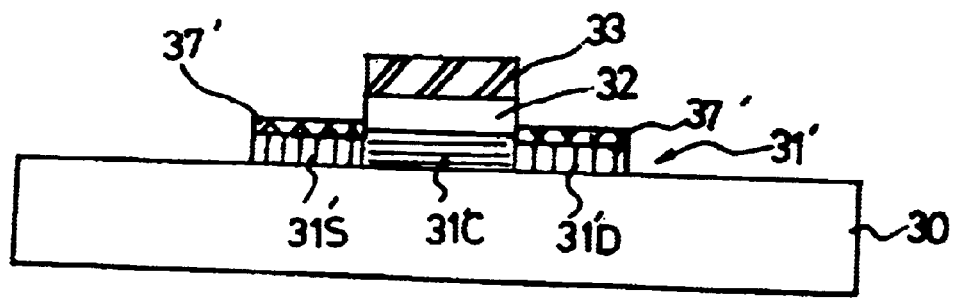
Figure 4A:
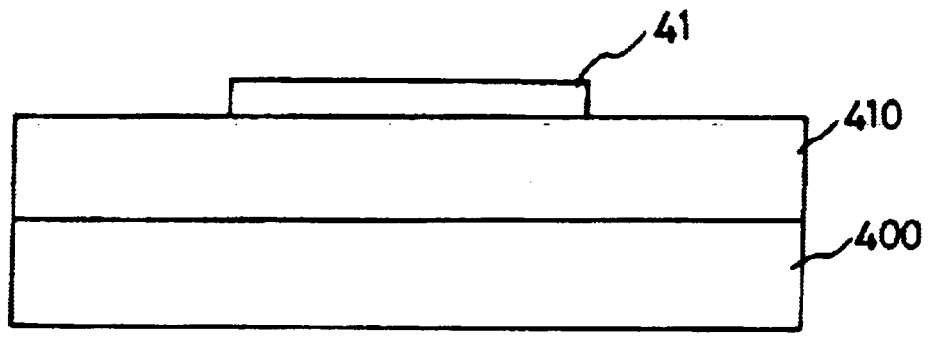
FIG. 4A to FIG. 4E show a process of fabricating a thin film transistor according to a first embodiment of the present invention.

Referring to FIG. 4A, an amorphous silicon layer is deposited on a substrate 400, and then, the amorphous silicon layer is etched by photolithography to form an active layer 41. The amorphous silicon layer of 1000 Å thickness is deposited on the substrate 400 by PECVD at 300° C. using Si2H6. The active layer 41 is etched by photolithography by RIE system using SF6 gas.

The substrate 400 is prepared using glass substrate itself. The substrate 400 can also be prepared by depositing an oxide layer 410 of 5000 Å thickness on a silicon wafer having a first conductivity type, such as p-type silicon wafer.

Figure 4B:
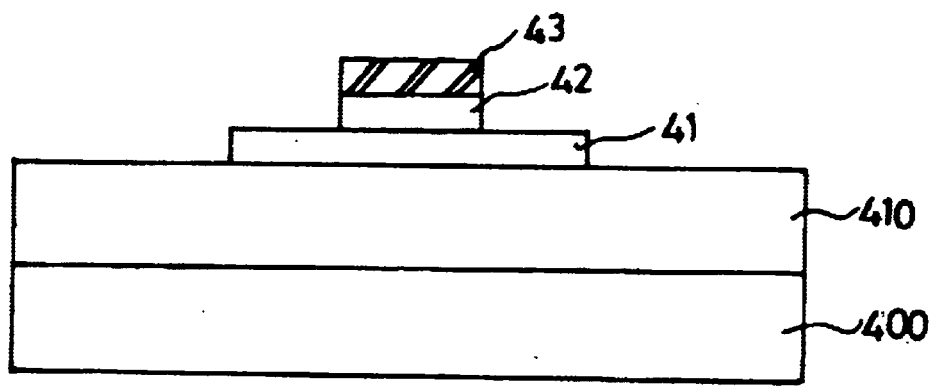

Referring to FIG. 4B, an oxide layer and an Mo layer is deposited on the active layer and the substrate in succession, and then, the Mo layer and the oxide layer are etched by photolithography in succession to form a gate electrode 43 and a gate insulating layer 42.

An oxide layer of 1000 Å thickness is deposited by RF sputtering from an SiO2 target in a 25% oxygen-75% argon mixture at temperature of 200° C. and an Mo layer of 3500 Å thickness is deposited by sputtering at room temperature. Then, the Mo layer is etched by photolithography using a mask for forming a gate pattern to form the gate electrode 43. The oxide layer is etched to form the gate insulating layer 42.

Figure 4C:
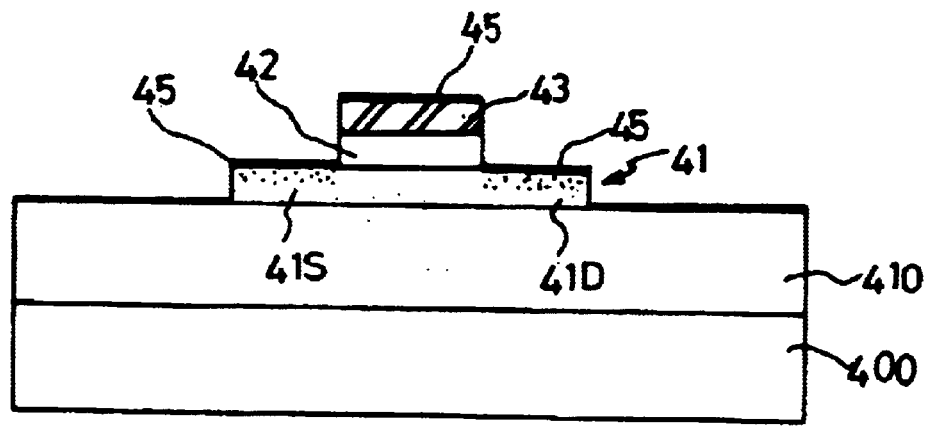
Figure 4D:
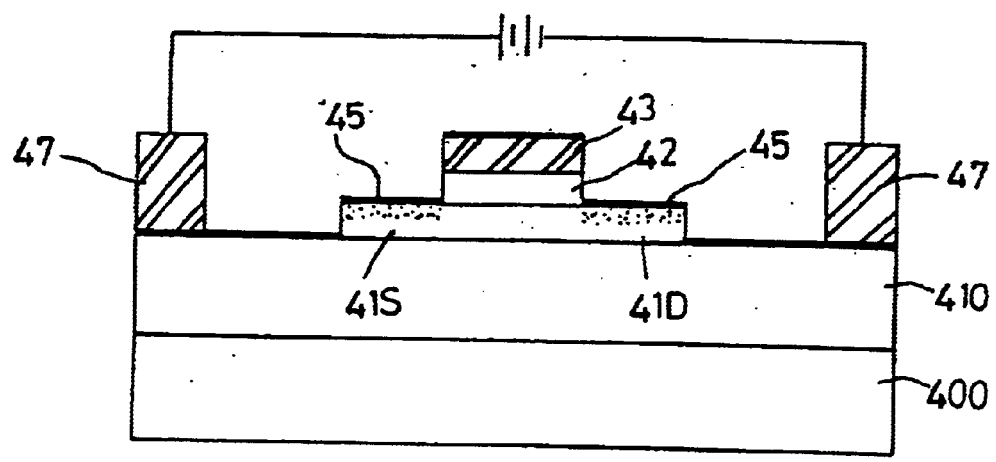

Referring to FIG. 4C, impurities having a first conductivity type are doped in the active layer 41 to form a source region 41S and a drain region 41D in the active layer 41. Then, nickel thin film 45 is deposited on the exposed and doped active layer.

Ion mass doping using PH3 is performed at exposed portions of the resultant substrate at room temperature, and then, nickel thin film of no more than 30 Å thickness is formed on the doped silicon layer of the active layer 41. Here, the step of forming metal layers on the doped portions of the amorphous silicon layer may be performed before the step of doping impurities in exposed portions of the amorphous silicon layer. Here, the nickel thin film layer could be replaced with metal thin film formed by transition metal material comprising Pd, Co, Cu, Cr, Au, Fe or Ti Referring to FIG. 4D, thermal treatment and electric field are applied to the resultant substrate comprising nickel thin film 45.

Electrodes 47 such as Au were formed on the resultant substrate and voltage is applied to the Au electrodes during the thermal treatment in $N_2$ ambient.

Figure 4E:
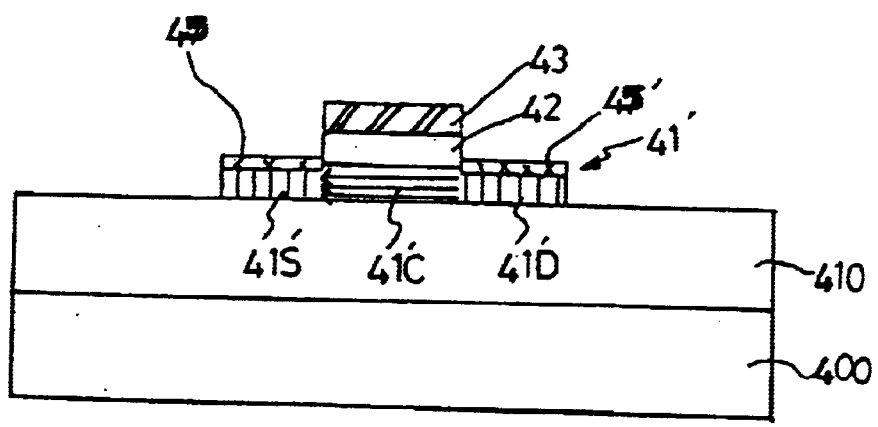

Referring to FIG. 4E, as a result of applying electric field and thermal treatment at a temperature below 500° C., the amorphous silicon layer is crystallized into polysilicon layer 41', thereby providing polysilicon thin film transistor. Here, the Au electrodes could be replaced with metal electrodes formed by conventional metal material including Pt, Fe or Al.

When performing thermal treatment, a portion of the amorphous silicon layer that contacts the nickel thin film becomes nickel silicide 45'. A portion of the nickel silicide is used as a nucleus for crystallizing amorphous silicon into polysilicon. Silicon portions contacting nickel thin film 41, for example, the source region 41'S and the drain region 41'D, are crystallized by MIC, and the nickel-free regions, for example, the channel region 41'C, are crystallized by crystallization of FALC (Field Aided Lateral Crystallization). The nickel on the surface of the substrate is volatilized during thermal treatment. The nickel on the gate electrode is either volatilized or remains. In case the nickel remains on the gate electrode, the nickel is used as the gate electrode also.

The crystallization rate of FALC is much faster than that of the crystallization method of the related arts. FALC shows the directionality in crystallization velocity at the negative electrode is faster than that at the positive electrode. This lateral crystallization is rapidly performed at the negative (−) electrode relative to the positive (+) electrode due to the effect of the applied electric field. As a consequence, it is possible to accelerate the unidirectional crystallization of silicon with the application of the electric field. In FALC, NiSi2 phase is driven by the electric field. It is believed that the advancing growth front sweeps across the channel region and stops at either of the source and drain region depending on the polarity. Therefore, there is no metal contamination in the channel region in the thin film transistor fabricated according to the present invention.

When performing thermal treatment, the doped impurities in the active layer undergo activation.

The present invention uses the technique of forming the electric field for crystallizing the amorphous silicon layer during thermal treatment of the resultant substrate.

Figure 5:
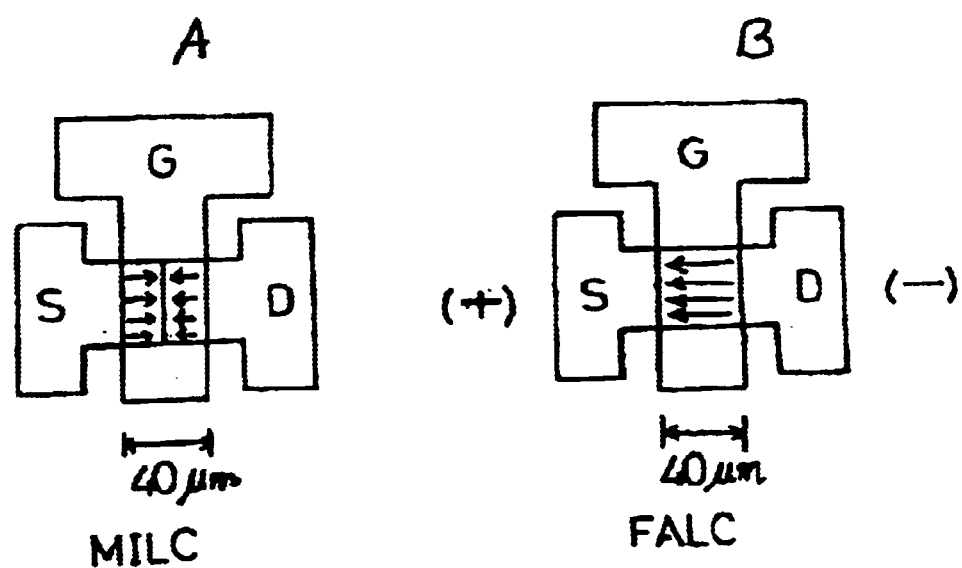
FIG. 5 shows metal induced lateral crystallization (MILC) and field aided lateral crystallization (FALC)

FIG. 5A and FIG. 5B show two specimens crystallized by conventional MILC technique (as described in the second example of the related art) and FALC technique according to the present invention (as described in the first embodiment of the present invention) at an identical condition, at a temperature of 500° C. and at 2 hours, respectively. The only difference was the application of an electric field of 11.8 V/cm to the specimen crystallized by FALC technique.

Referring to FIG. 5A which shows MILC, crystallization starts at the source and drain region of the transistor and propagates from both sides to the center of the channel. Therefore, its leading edge(NiSi$_2$) ends up midway between the source and drain (center of the gate). The crystallization in the channel region was not complete even after 2 hours had elapsed. The crystallization rate was 8 μm/h. It is believed that the metallic phases at the center of the channel deteriorate the electrical properties of the poly-silicon TFTs.

Referring to FIG. 5B which shows FALC, on the other hand, with the aid of an electric field of 11.8V/cm, for example, and under the same crystallization conditions, the complete directional crystallization of polarity dependence is shown from the negative electrode to the positive electrode. The crystallization in the channel region was completed within 2 hours time. The crystallization rate was 55 μm/h and the metallic contamination was swept out of the channel region.

Figure 6:
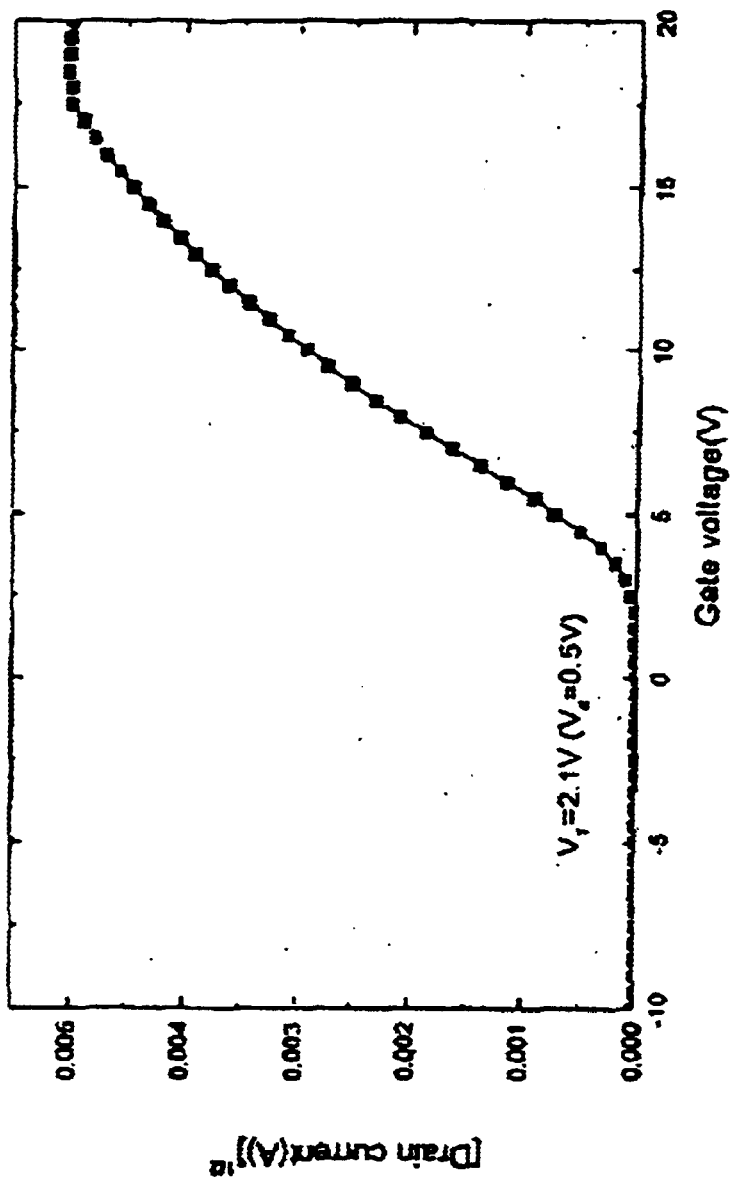
FIG. 6 shows a threshold voltage of the thin film transistor according to the first embodiment of the present invention.

FIG. 6 shows the threshold voltage of 2.1V for the FALC poly-silicon TFT fabricated according to the first embodiment of the present invention.

FIG. 7 shows the transfer characteristics of the FALC poly-silicon TFT fabricated according to the first embodiment of the present invention.

A summary of the TFTs performance parameters is given in Table 1.

TABLE 1

|  | MILC TFT (500° C., 10 h) | FALC TFT (500° C., 10 h, E = 4 V/cm) |
| --- | --- | --- |
| L/W (μm) | 15/15 | 15/15 |
| Mobility (cm2/Vs) | 22.65 | 56.74 |
| vth (V) | 2.6 | 2.1 |
| on/off ratio | 3.09 × 106 | 2.69 × 107 |
| Off current (A) | 1.31 × 10−12 | 3.72 × 10−13 |

As shown in FIG. 6, FIG. 7 and Table 1, the transfer characteristics for the FALC TFT as well as the conventional MILC TFT is well behaved in general. For off-current (leakage-current) characteristics, a noticeably low off current of 3.72×10−13A is shown, which means lower power consumption.

FIG. 8A to FIG. 8E show a process of fabricating a thin film transistor according to a second embodiment of the present invention.

Figure 8A:
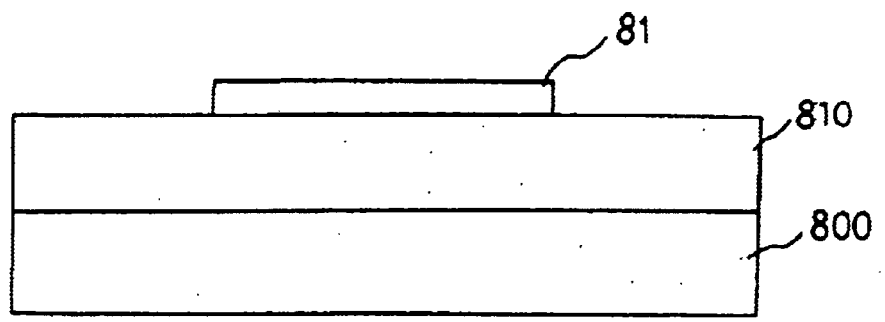
FIG. 8A to FIG. 8E show a process of fabricating a thin film transistor according to a second embodiment of the present invention.

Referring to FIG. 8A, a first amorphous silicon layer for forming the active layer is formed on a substrate 800.

An amorphous silicon layer of 1000 Å thickness is deposited on the substrate 800 by Low Pressure Chemical Vapor Deposition (LPCVD) at 480° C. using Si2H6, for example, and then is etched by photolithography to form the first amorphous silicon layer 81 as the active layer by an RIE system using SF6 gas and by using a mask for an active pattern.

The substrate 800 is prepared using glass substrate itself. The substrate 800 may be prepared by depositing an oxide layer 810 of 5000 Å thick on silicon wafer having a first conductivity type, such as a p-type silicon wafer.

Figure 8B:
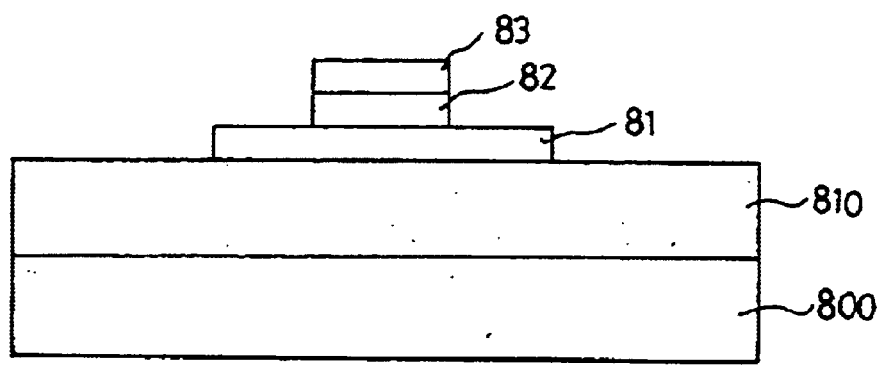

Referring to FIG. 8B, a gate insulating layer 82 and a second amorphous silicon layer for forming a gate electrode are formed on the first amorphous silicon layer 81.

An oxide layer of 1000 Å thickness is deposited by RF sputtering from an SiO2 target in a 20% oxygen-80% argon mixture and another amorphous silicon layer of 1000 Å thick is deposited by Plasma Enhanced Chemical Vapor Deposition (PECVD) at a temperature of 300° C. Then, the amorphous silicon layer is etched by photolithography using a mask for gate patterning to form gate electrode 83. The oxide layer is etched to form gate insulating layer 82.

Figure 8C:
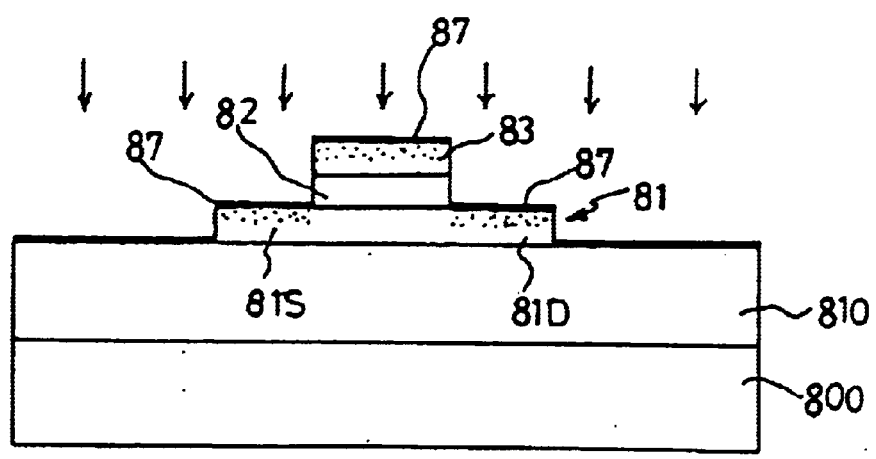

Referring to FIG. 8C, impurities having a first conductivity type are doped at exposed portions of the first and second amorphous silicon layers 81 and 83. Then, nickel thin film 87 is formed on the exposed and doped silicon layers. As a result of doping, a source region and a drain region 81D are formed in the first amorphous silicon layer 81.

Ion doping using 3% B2H6 is performed in exposed portions of the resultant substrate at room temperature. Then, nickel thin film of no more than 30 Å thickness is formed on the doped silicon layers 81 and 83. Here, the step of forming metal layers on the doped portions of the amorphous silicon layers can be performed before the step of doping impurities in exposed portions of the amorphous silicon layers. The nickel thin film layer may be replaced with a metal thin film formed by one or more of the transition metal material including Cu, Ni, Fe, Co, Ru, Rh, Pd, Os, Ir, Pt, Se, Ti, V, Cr, Mn, Zn, Au and Ag. Additional transition metal materials may be found in U.S. Pat. Nos. 5,605,846 and 5,654,203, for example.

Figure 8D:
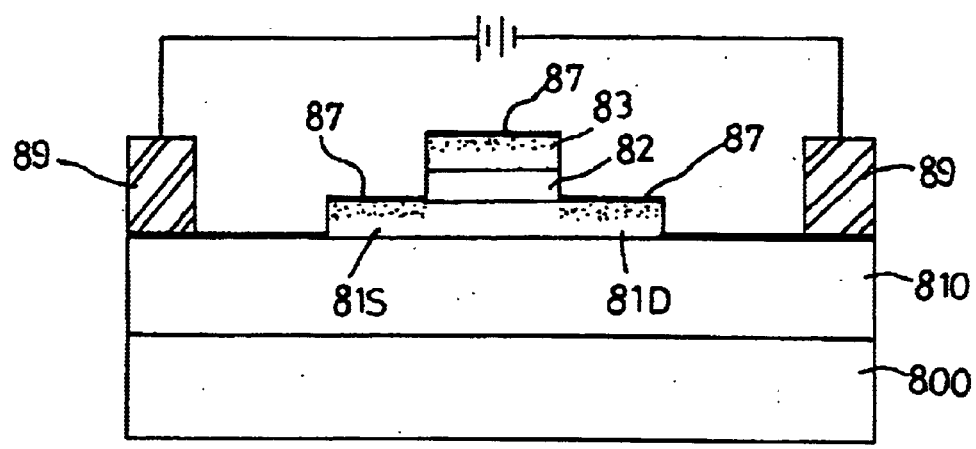
Figure 8E:
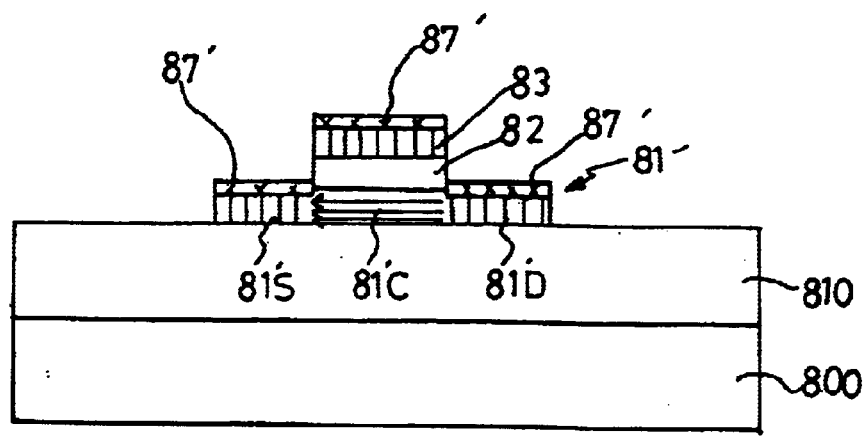

Referring to FIG. 8D, thermal treatment and electric field are applied to the resultant substrate comprising nickel thin film 87.

Electrodes 89 such as Au are formed on the resultant substrate and electric field is applied simultaneously with thermal treatment. Here, the Au electrodes may be replaced with metal electrodes formed by conventional metal material including Pt, Fe or Al.

As a result of applying the electric field and thermal treatment at a temperature below 500° C., the amorphous silicon layer is crystallized into polysilicon layer 81', thereby providing a polysilicon thin film transistor.

When performing thermal treatment, a portion of the amorphous silicon layer that contacts the nickel thin film becomes nickel silicide 87'. A portion of the nickel silicide is used as a nucleus for crystallizing amorphous silicon into polysilicon. Silicon portions contacting nickel thin film 81, for example, the source region 81'S and the drain region 81'D are crystallized by MIC, and the nickel-free region, for example, the channel region 81'C, is crystallized by FALC.

The nickel on the surface of the substrate is volatilized during thermal treatment. The nickel on the gate electrode is either volatilized or remains.

The crystallization rate of FALC is much faster than that of the crystallization method of the related arts. FALC shows the directionality in crystallization rate at the negative electrode is faster than that at the positive electrode. In FALC, NiSi2 phase is driven by the electric field. It seems that the advancing growth front will sweep across the channel region and stop at either the source or drain region depending on the polarity. Therefore, there is no metal contamination in the channel region in the thin film transistor fabricated according to the present invention.

When performing thermal treatment, the doped impurities in the active layer undergo activation.

Figure 9:
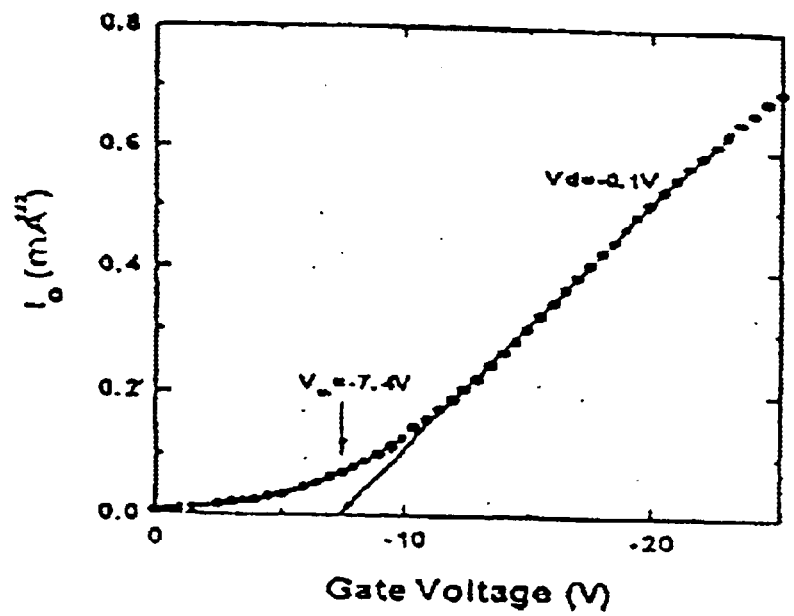
FIG. 9 shows a threshold voltage of the thin film transistor according to the second embodiment of the present invention.

FIG. 9 shows the threshold voltage of −7.4 V for the FALC poly-silicon TFT fabricated according to the second embodiment of the present invention.

Figure 10:
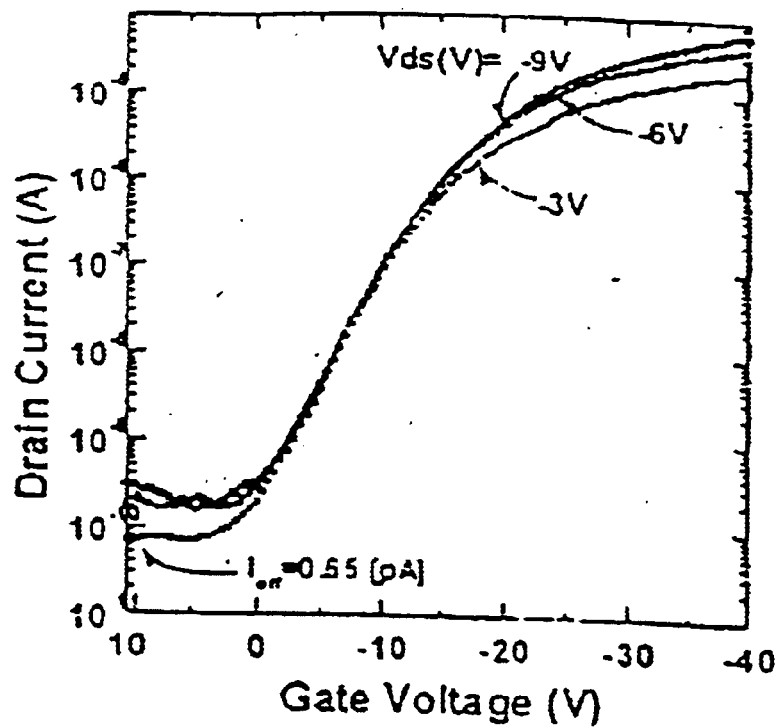
FIG. 10 shows transfer characteristics of the thin film transistor according to the second embodiment of the present invention.

FIG. 10 shows the transfer characteristics of the FALC poly-silicon TFT fabricated according to the second embodiment of the present invention.

A summary of the TFTs performance parameters is given in Table 2.

TABLE 2

|  | The conventional MILC TFT (600° C., 24 h) | FALC TFT (500° C., 80 min, E = 4 V/cm) |
| --- | --- | --- |
| L/W (μm) | 10/10 | 8/20 |
| Mobility (cm2/Vs) | 15.7 | 23 |
| Vth (V) | 13 | −7.3 |
| on/off ratio | 1.37 × 106 | 6.5 × 105 (Vd = −0.1 V) |
| Off current (A) | 2.1 × 10−10 | 6.5 × 10−11 |

As shown in FIG. 9, FIG. 10 and Table 2, the characteristics for the FALC devices as well as the conventional TFTs devices were well behaved in general. In off-current (leakage-current) characteristics, a noticeably low off current of 6.5×10−11 was shown, which means lower power consumption.

The present invention provides a thin film transistor with good physical characteristics such as high electric field mobility, high on/off ratio, and low leakage current by fabricating thin film transistors in a short process time through the electric field and thermal treatment.

Thin film transistors according to the present invention has been successfully fabricated in an amorphous silicon layer using FALC instead of conventional MILC in order to get high-performance. The conventional crystallization temperature of amorphous silicon layer is at least 600° C., the present technique is attractive because it can lower the process temperature below 500° C. and reduce the process time.

The FALC demonstrated polarity dependence of directional crystallization, which leads to non-contaminated single grained channel. Hence, the novel technique, FALC, will enable the use of glass substrates for the poly-Si TFT application. Moreover FALC has also proven its superiority in quality of the devices.

The present invention is used in fabricating thin film transistors of the first and second embodiments, and thin film transistors having offset or LDD structure.

It will be apparent to those skilled in the art that various modifications can be made in the method of fabricating a thin film transistor of the present invention without departing from the sprit or scope of the invention. Thus, it is intended that the present invention cover the modifications and variations of this invention provided they come within the scope of the appended claims and their equivalents.

What is claimed is:

1. A method of fabricating a thin film transistor for a liquid crystal display having a plurality of pixels comprising:
   forming an amorphous silicon layer as an active layer on a glass substrate;
   forming a gate insulating layer and a gate electrode on the amorphous silicon layer;
   doping impurities of a first conductive type in the amorphous silicon layer;
   forming a metal layer on exposed portions of the amorphous silicon layer; and
   crystallizing the amorphous silicon layer by applying thermal treatment and an electric field to the resultant substrate,
   wherein the thin film transistor includes source and drain regions and a channel region, and wherein the amorphous silicon layers in the source and drain regions are crystallized by MIC and the amorphous silicon layer in the channel region is crystallized by FALC during the application of the thermal treatment and electric field, whereby the crystallized silicon layer in the channel region is substantially free from metal atoms of the metal layer.

2. The method of fabricating a thin film transistor according to claim 1, wherein the substrate includes a material selected from the group consisting of a glass and a glass having an oxide layer formed thereon.

3. The method of fabricating a thin film transistor according to claim 1, wherein the substrate includes a material selected from the group consisting of a silicon wafer and a silicon wafer having an oxide layer formed thereon.

4. The method of fabricating a thin film transistor according to claim 1, wherein the gate electrode is formed by at least one transition metal selected from the group consisting of Mo, Cr and Co.

5. The method of fabricating a thin film transistor according to claim 1, wherein the impurities include PH$_3$.

6. The method of fabricating a thin film transistor according to claim 1, wherein the metal layer has a thickness of no more than 30 Å.

7. The method of fabricating a thin film transistor according to claim 6, wherein the metal layer is formed by at least one transition metal selected from the group consisting of Cu, Ni, Fe, Co, Ru, Rh, Pd, Os, Ir, Pt, Se, Ti, V, Cr, Mn, Zn, Au and Ag.

8. The method of fabricating a thin film transistor according to claim 1, wherein the step of forming metal layers on exposed portions of the amorphous silicon layer is performed before the step of doping impurities of first conductive type in exposed portions of the amorphous silicon layer.

9. The method of fabricating a thin film transistor according to claim 1, further comprising a step of forming electrodes for applying a voltage to form the electric field on the resultant substrate.

10. The method of fabricating a thin film transistor according to claim 9, wherein the electrodes are formed by a metal selected from the group consisting of Au, Pt, Fe and Al.

11. The method of fabricating a thin film transistor according to claim 9, wherein at least a first electrode and a second electrode are formed prior to the crystallizing step, and crystallization of the amorphous silicon layer occurs faster at the first electrode than at the second electrode.

12. The method of fabricating a thin film transistor according to claim 9, wherein at least a negative electrode and a positive electrode are formed prior to the crystallizing step, and crystallization of the amorphous silicon layer occurs faster at the negative electrode than at the positive electrode.

13. The method of fabricating a thin film transistor according to claim 1, where the heat treatment is performed at about 500° C.

14. A method of fabricating a thin film transistor for a liquid crystal display having a plurality of pixels comprising:
   forming a first amorphous silicon layer as an active layer on a glass substrate;
   forming a gate insulating layer and a second amorphous silicon layer as a gate electrode on the first amorphous silicon layer;
   doping impurities of a first conductive type in the first and second amorphous silicon layers;
   forming a metal layer on doped portions of the first and second amorphous silicon layers; and
   crystallizing the first and second amorphous silicon layers by performing heat treatment and applying an electric field on the resultant substrate,
   wherein the thin film transistor includes source and drain regions and a channel region, and wherein the first amorphous silicon layers in the source and drain regions are crystallized by MIC and the first amorphous silicon layer in the channel region is crystallized by FALC during the application of the thermal treatment and electric field, whereby the first crystallized silicon layer in the channel region is substantially free from metal atoms of the metal layer.

15. The method of fabricating a thin film transistor according to claim 14, wherein the substrate includes one of a glass and an oxide layer on a glass.

16. The method of fabricating a thin film transistor according to claim 14, wherein the substrate is prepared by depositing an oxide layer on a silicon wafer.

17. The method of fabricating a thin film transistor according to claim 14, wherein the step of forming the gate insulating layer and the second amorphous silicon layer comprises the steps of:
   depositing an oxide layer and an amorphous silicon layer on the substrate comprising the first amorphous silicon layer;
   etching the oxide layer and the amorphous silicon layer using a mask for forming the gate electrode.

18. The method of fabricating a thin film transistor according to claim 14, wherein the impurities include p-type or n-type.

19. The method of fabricating a thin film transistor according to claim 14, wherein the metal layer has a thickness of no more than 30 Å.

20. The method of fabricating a thin film transistor according to claim 14, the step of forming metal layers on the doped portions of the amorphous silicon layer is performed before the step of doping impurities of first conductive type in exposed portions of the first and second amorphous silicon layers.

21. The method of fabricating a thin film transistor according to claim 14, further comprising a step of forming electrodes for applying a voltage to form the electric field on the resultant substrate.

22. The method of fabricating a thin film transistor according to claim 21, wherein the electrodes are formed by a metal material including Au, Pt, Fe and Al.

23. The method of fabricating a thin film transistor according to claim 21, wherein at least a first electrode and a second electrode are formed, and crystallization of the amorphous silicon layer occurs faster at the first electrode than at the second electrode.

24. The method of fabricating a thin film transistor according to claim 21, wherein the electrodes includes a negative electrode and a positive electrode, and crystallization of the amorphous silicon layer occurs faster at the negative electrode than at the positive electrode.

25. A method of fabricating a thin film transistor for a liquid crystal display having a plurality of pixels comprising:
   forming an amorphous silicon layer as an active layer on a glass substrate;
   forming a gate insulating layer and a gate electrode on the amorphous silicon layer;
   forming a metal layer on exposed portions of the amorphous silicon layer;
   doping impurities of a first conductive type in the amorphous silicon layer after the metal layer is formed; and
   crystallizing the amorphous silicon layer by applying thermal treatment and an electric field to the resultant substrate,
   wherein the thin film transistor includes source and drain regions and a channel region, and wherein the amorphous silicon layers in the source and drain regions are crystallized by MIC and the amorphous silicon layer in the channel region is crystallized by FALC during the application of the thermal treatment and electric field, whereby the crystallized silicon layer in the channel region is substantially free from metal atoms of the metal layer.

26. The method of fabricating a thin film transistor according to claim 25, wherein the substrate includes a material selected from the group consisting of a glass and a glass having an oxide layer formed thereon.

27. The method of fabricating a thin film transistor according to claim 25, wherein the substrate includes a material selected from the group consisting of a silicon wafer and a silicon wafer having an oxide layer formed thereon.

28. The method of fabricating a thin film transistor according to claim 25, wherein the gate electrode is formed by at least one transition metal selected from the group consisting of Mo, Cr and Co.

29. The method of fabricating a thin film transistor according to claim 25, wherein the impurities include $PH_3$.

30. The method of fabricating a thin film transistor according to claim 25, wherein the metal layer has a thickness of no more than 30 Å.

31. The method of fabricating a thin film transistor according to claim 30, wherein the metal layer is formed by at least one transition metal selected from the group consisting of Cu, Ni, Fe, Co, Ru, Rh, Pd, Os, Ir, Pt, Se, Ti, V, Cr, Mn, Zn, Au and Ag.

32. The method of fabricating a thin film transistor according to claim 25, wherein the heat treatment is performed at about 500° C.

33. The method of fabricating a thin film transistor according to claim 25, further comprising a step of forming electrodes for applying a voltage to form the electric field on the resultant substrate.

34. The method of fabricating a thin film transistor according to claim 33, wherein the electrodes are formed by a metal selected from the group consisting of Au, Pt, Fe and Al.

35. The method of fabricating a thin film transistor according to claim 33, wherein at least a first electrode and a second electrode are formed prior to the crystallizing step, and crystallization of the amorphous silicon layer occurs faster at the first electrode than at the second electrode.

36. The method of fabricating a thin film transistor according to claim 33, wherein at least a negative electrode and a positive electrode are formed prior to the crystallizing step, and crystallization of the amorphous silicon layer occurs faster at the negative electrode than at the positive electrode.

37. A method of fabricating a thin film transistor for a liquid crystal display having a plurality of pixels comprising:

forming an amorphous silicon layer as an active layer on a glass substrate;

forming a gate insulating layer and a gate electrode on the amorphous silicon layer;

doping impurities of a first conductive type in the amorphous silicon layer;

forming a metal layer on exposed portions of the amorphous silicon layer; and crystallizing the amorphous silicon layer by applying thermal treatment and an electric field to the resultant substrate, wherein the thin film transistor includes source and drain regions and a channel region, and wherein the amorphous silicon layers in the source and drain regions are crystallized by MIC and the amorphous silicon layer in the channel region is crystallized by FALC during the application of the thermal treatment and electric field, whereby the crystallized silicon layer in the channel region is substantially free from metal atoms of the metal layer.

* * * * *